(12) United States Patent
Dimitrakopoulos et al.

(10) Patent No.: US 7,026,643 B2
(45) Date of Patent: Apr. 11, 2006

(54) ORGANIC N-CHANNEL SEMICONDUCTOR DEVICE OF N,N' 3,4,9,10 PERYLENE TETRACARBOXYLIC DIIMIDE

(75) Inventors: Christos Dimitrios Dimitrakopoulos, West Harrison, NY (US); Jeffrey Donald Gelorme, Plainville, CT (US); Teresita Ordonez Graham, Irvington, NY (US); Laura Louise Kosbar, Mohegan Lake, NY (US); Patrick Roland Lucien Malenfant, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 10/014,766

(22) Filed: Dec. 11, 2001

(65) Prior Publication Data

US 2002/0164835 A1   Nov. 7, 2002

Related U.S. Application Data

(60) Provisional application No. 60/288,692, filed on May 4, 2001.

(51) Int. Cl.
*H01L 29/772*   (2006.01)
(52) U.S. Cl. .......................... 257/40; 257/288; 257/72
(58) Field of Classification Search ............... 257/40, 257/288, 72; 438/99
See application file for complete search history.

(56) References Cited

U.S. PATENT DOCUMENTS

| 4,611,385 | A | * | 9/1986 | Forrest et al. ................ 438/16 |
| 5,405,724 | A | * | 4/1995 | Hsieh et al. ................ 430/58.8 |
| 5,449,582 | A | * | 9/1995 | Hsieh et al. ................ 430/134 |
| 5,981,970 | A |   | 11/1999 | Dimitrakopoulos et al. .. 257/40 |
| 6,278,127 | B1 | * | 8/2001 | Dodabalapur et al. ........ 257/40 |
| 6,326,640 | B1 | * | 12/2001 | Shi et al. ...................... 257/40 |
| 6,387,727 | B1 | * | 5/2002 | Katz et al. .................... 438/99 |

FOREIGN PATENT DOCUMENTS

EP            1041653            3/2000

OTHER PUBLICATIONS

Struijk et al. "Liquid Crystalline Perylene Diimides: Architecture and Charge Carrier Mobilities" Journal of the American Chemical Society 2000, 122, pp. 11057-11066.*
Dodabalapur et al "Organic Transistors Two Dimensional Transport and Improved Electrical Characteristics", Science, Apr. 1995, pp. 270-271.

(Continued)

*Primary Examiner*—Laura M. Schillinger
(74) *Attorney, Agent, or Firm*—Daniel P. Morris; Alvin J. Riddles

(57) ABSTRACT

The invention provides a device comprising an improved n-channel semiconducting film. This film consists of a perylene tetracaboxylic acid diimide compound and was deposited onto substrates by vacuum sublimation. Thin film transistor devices comprising such films as the semiconducting channel exhibit a field effect electron mobility greater than 0.01 $cm^2/Vs$ and an on/off ratio of 10000 and higher.

3 Claims, 4 Drawing Sheets

N.N' PERYLENE–3,4,9,10,–TETRACARBOXYLIC ACID DIIMIDE

OTHER PUBLICATIONS

Sze, "Physics of Semiconductor Devices", John Wiley & Sons, 1981 pp. 438-443.
Dodabalapur et al, "Complementary Circuits with Organic Transistors", App Phys. Ltrs. 1996, vol. 69 pp. 4227-4229.
Dodabalapur et al., "Hybrid Organinc/Inorganic Complementary Circuits" App. Phys. Ltrs., 1996, vol. 68, p. 2246-2248.
Haddon et al, "$C_{60}$ Thin Film Transistors", App. Phys. Ltrs. 1995, vol. 67, p. 121-123.
Bao et al, "NewAirStable n-Channel Organic Thin Film Transistors" Am. Chem Soc. 1998, vol. 120, p. 207-208.
Laquindanum et al "n-Channel Organic Transistor Materials Based on Napthalene Frameworks," J. Am. Chem Soc. 1996, vol. 118, p. 11331.
Katz et al, "Napthalene Tetracarboxylic Diimide-Based n-Channel Transistor Semiconductors: Structural Variation and Thiol Enhanced Gold Contacts", J. Am. Chem. Soc, 2000 vol. 122, p. 7787.
Katz et al, "A Soluble and Air Stable Organic Semiconductor with High Electron Moblity", Nature, 2000, vol. 404, p. 478.
Schön et al, "Perylene: A Promising Organic Field-Effect Transistor Material", App. Phys. Ltrs, 2000, vol. 77, p. 3776.
Struisik et al, "Liquid Crystalline Perylene Diimides: Architecture and Charge Carrier Mobilities" J. Amer. Chem. Soc. 2000, vol. 122 p. 11057.
Horowitz et al, "Evidence for n-Type Conduction in a Perlyene Tetracarboxylic Diimide Derivative", Adv. Mater, 1996, vol. 8, p. 242.
Ostrick et al, "Conductivity-Type Anisotropy in Molecular Solids", J. App. Phys, 1997, vol. 81, p. 6804-6808.
Rademacher et al, "Lösliche Perylen-Floreszenz Farbe Stoffe mit Hoher Photostabilitat", Chem. Ber., 1982, vol. 115, p. 2927.
Dimitrakopoulos et al, "Organic Thin Film Transistors for Large Area Electronics", Advanced Materials, (2002), vol. 14, pp. 99-117.

* cited by examiner

N.N' PERYLENE-3,4,9,10,-TETRACARBOXYLIC ACID DIIMIDE

ORGANIC N-CHANNEL SEMICONDUCTOR DEVICE OF N,N' 3,4,9,10 PERYLENE TETRACARBOXYLIC DIIMIDE

This non provisional application is a conversion of provisional patent application No. 60/288,692 filed May 4, 2001.

FIELD OF THE INVENTION

The invention is in the field of the plastic circuitry and components being employed in electronic technology, and in particular to devices containing N,N" 3,4,9,10 perylene tetracarboxylic diimide semiconductor materials such devices as organic thin film transistors.

BACKGROUND OF THE INVENTION

The thin film transistor when made of organic materials in expected to become a key component of the plastic circuitry in display drivers of portable computers and pagers, and memory elements of transaction cards and identification tags, where ease of fabrication, mechanical flexibility, and moderate operating temperatures are important considerations.

At the present state of the art there are circuitry situations such as with complimentary circuitry where properties unavailable in the present organic semiconductor materials such as the ability to impart locallized n and p conductivity would be beneficial. Only a limited number of materials have been developed thus far in the art for the n-type component of organic complementary circuitry. There is a need in the art for simplified organic thin film transistor technology that provides higher electron mobility.

SUMMARY OF THE INVENTION

Through the invention, improved mobilities and current on/off ratios, hereinafter called on/off ratios, in organic thin film transistor devices, are achieved. In the invention, an n-channel semiconducting film of a fused-ring tetracarboxylic diimide compound based on a perylene framework is employed that exhibits a field effect electron mobility that is greater than 0.6 $cm^2$/Vs in the film form which in turn also provides device on/off ratios in the range of at least 10000. The n-channel semiconductor compounds of the invention do not require treatment of device contact electrodes in order to obtain high mobilities and in processing they possess significant volatility that vapor phase deposition, where desired, is available.

DESCRIPTION OF THE INVENTION

Figure 1:
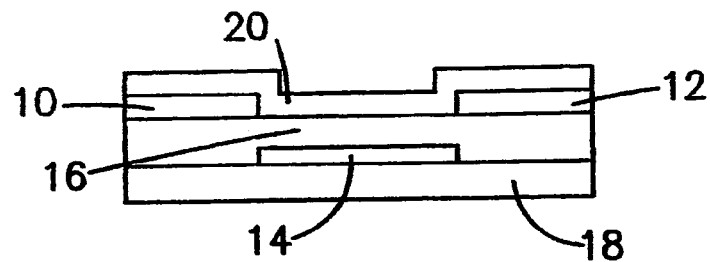
FIGS. 1 and 2 are cross sectional views of N,N' 3,4,9,10 perylene tetracarboxylic diimide semiconductor material organic thin film transistors, wherein in FIG. 1 a bottom contact configuration is illustrated and in FIG. 2 a top contact configuration is illustrated.
Figure 2:
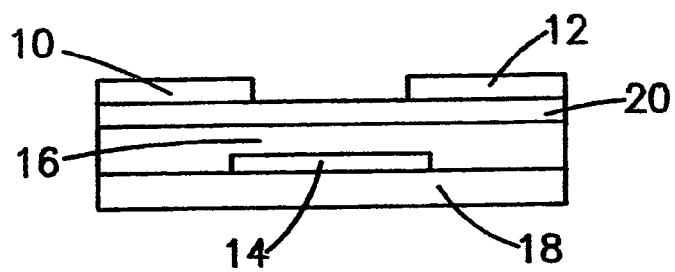

Referring to FIGS. 1 and 2. The illustrated devices are cross sectional views of typical organic thin film transistors, wherein in FIG. 1 a bottom contact configuration is illustrated and in FIG. 2 a top contact configuration is illustrated.

An organic TFT is shown in FIGS. 1 & 2. Each TFT contains a source electrode 10, a drain electrode 12, a gate electrode 14, a gate dielectric 16, a substrate 18, and the semiconductor material N,N"-di(n-1H,1H-perfluooctyl) perylene 3,4,9,10-tetracarboxylic acid diimide, labelled element 20.

When the TFT operates in an accumulation mode, the charges injected from the source 10 into the semiconductor are mobile and conduct the source-drain channel current, mainly in a thin channel region within about 100 Angstroms of the semiconductor-dielectric interface. See A. Dodabalapur, L. Torsi H. E. Katz, Science 1995, 268, 270. In the configuration of FIG. 1, the charge need only be injected laterally from the source 10 to form the channel. In the absence of a gate field, the channel ideally has few charge carriers, as a result there is ideally no source-drain conduction. The off current is defined as the current flowing between the source electrode 10 and the drain electrode 12 when charge has not been intentionally injected into the channel by the application of a gate voltage, and for an accumulation mode TFT, this occurs for a gate-source voltage more positive, assuming a p-channel, or negative assuming an n-channel than a certain voltage known as the threshold voltage. See Sze in Semiconductor Devices—Physics and Technology, John Wiley & Sons (1981), pages 438–443. The on current is defined as the current flowing between the source 10 and the drain 12 when charge carriers have been accumulated intentionally in the channel by application of an appropriate voltage to the gate electrode, and the channel is conducting. For a p-channel accumulation-mode TFT, this occurs at a gate-source voltage more negative an the threshold voltage, and for an n-channel accumulation mode TFT, this occurs at gate-source voltage more positive than the threshold voltage. It is desirable for this threshold voltage to be zero, or slightly positive, for n-channel operation. Switching between on and off is accomplished by the application and removal of an electric field from the gate electrode 14 across the gate dielectric 16 to the semiconductor-dielectric interface, effectively charging a capacitor.

Organic semiconductors provide the switching and/or logic elements in such TFTs. Significant progress has been made in the development of these semiconductors, with mobilities well above 0.01 $cm^2$/Vs and on/off ratios greater than 1000 demonstrated for several classes of compounds, including compounds capable of operation in air. With these properties, TFTs are capable of use for applications such as pixel drivers for displays and identification tags. However, most of the compounds exhibiting these desirable properties are p-type, meaning that negative gate voltages, relative to the source voltage, are applied to induce positive charges (holes) in the channel region of the device. Yet, one important type of TFT circuit, known as a complementary circuit, desirably contains an n-type semiconductor material exhibiting desirable properties, in addition to a p-type semiconductor material. See Dodabalapur et al. in "Complementary circuits with organic transistors," Appl. Phys. Lett. 1996, 69, 4227. The fabrication of complementary circuits requires at least one p-channel TFT and at least one n-channel TFT, where the terminology n-channel indicates that positive gate voltages, relative to the source voltage, are applied to induce negative charges into the channel region of the device. In particular, simple components such as inverters have been realized using complementary circuit architecture. Advantages of complementary circuits, relative to ordinary TFT circuits, include lower power dissipation, longer lifetime, and better tolerance of noise. It is often desirable to have the mobility and on/off ratio of an n-channel device to be of similar magnitude as the mobility and on/off ratio of the p-channel device. Hybrid complementary circuits using an inorganic n-channel semiconductor are known, as reflected in Dodabalapur et al. *Appl. Phys. Lett.* 1996, 68, 2264.). but for ease of fabrication, an organic n-channel semiconductor material is desired.

Only a limited number of materials have been developed for the n-type component of such organic complementary circuits. Specifically, buckminsterfullerene C60 exhibits a mobility of 0.08 $cm^2/Vs$ but is considered to be unstable in air. See R. C. Haddon, A. S. Perel, R. C. Morris, T. T. M. Palstra, A. F. Hebard and R. M. Fleming, "$C_{60}$ Thin Film Transistors," *Appl. Phys. Let.* 1995, 67, 121. Perfluorinated copper phthalocyanine has a mobility of 0.03 $cm^2/Vs$, and is generally stable to air operation yet substrates must be heated to temperatures above 100° C. in order to maximize the mobility in this material. See "New Air-Stable n-Channel Organic Thin Film Transistors," Z. Bao, A. J. Lovinger, and J. Brown *J. Am. Chem, Soc.* 1998, 120, 207. Other n-channel semiconductors, including some based on a naphthalene framework, have also been reported, but with lower mobilities. See Laquindanum et al., "n-Channel Organic Transistor Materials Based on Naphthalene Frameworks," *J. Am. Chem, Soc.* 1996, 118, 11331. One such naphthalene-based n-channel semiconductor, tetracyanonaphthoquinodimethane (TCNNQD), is capable of operation in air, but the material has displayed a low on/off ratio and is also difficult to prepare and purify. More recently, it has been demonstrated that tetracarboxylic diimides based on a naphthalene framework provide n-channel organic semiconductors with mobilities >0.1 $cm^2/Vs$ using top-contact configured devices where the source and drain electrodes are on top of the semiconductor as is illustrated in FIG. 2. Comparable results could be obtained with bottom contact devices, that is where the source and drain electrodes are underneath the semiconductor as illustrated in FIG. 1, but a thiol underlayer had to be applied between the electrodes which had to be gold and the semiconductor. See Katz et al. "Naphthalenetetracarboxylic Diimide-Based n-Channel Transistor Semiconductors: Structural Variation and Thiol-Enhanced Gold Contacts" *J. Am. Chem. Soc.* 2000 122, 7787, and "A Soluble and Air-stable Organic Semiconductor with High Electron Mobility" *Nature* 2000 404, 478, and Katz et al., European Patent Application EP1041653. In the absence of the thiol underlayer, the mobility was found to be orders of magnitude lower in bottom-contact devices.

Recent work by Schön et al., demonstrate that high carrier mobilities can be obtained in single crystals of perylene. See Schön et al. "Perylene: A promising organic field-effect transistor material" *Appl. Phys. Lett.* 2000, 77, 3776. Relatively high mobilities have been measured in films of perylene tetracarboxylic diimides having linear alkyl side chains using pulse-radioslysis time-resolved microwave conductivity measurements. See Struijk et al. "Liquid Crystalline Peryllene Diimides: Architecture and Charge Carrier Mobilities" *J. Am. Chem. Soc. Vol.* 2000, 122, 11057. However, initial devices based on materials having a perylene framework used as the organic semiconductor led to devices with low mobilities, for example 1E-5 $cm^2/Vs$ for perylene tetracarboxylic dianhydride (PTCDA) and 1.5E-5 $cm^2/Vs$ for N,N'-diphenyl perylene tetracarboxylic acid diimide (PTCDI-Ph. See Horowitz et al. in "Evidence for n-Type Conduction in a Perylene Tetracarboxylic Diimide Derivative" *Adv. Mater.* 1996, 8, 242 and Ostrick, et al. *J. Appl. Phys.* 1997, 81, 6804.

In accordance with the invention the advantages offered by complementary TFT circuits in which both the p-type and the n-type component have comparable electrical performance characteristics, improved organic n-channel materials, and in particular, organic n-channel materials that exhibit high performance in bottom-contact configuration without the need for chemical underlayers are achieved through the use of an n-channel semiconducting film of a perylene tetracarboxylic acid diimide compound in fused ring form. Such compound is depositable onto substrates by vacuum sublimation.

Figure 3:
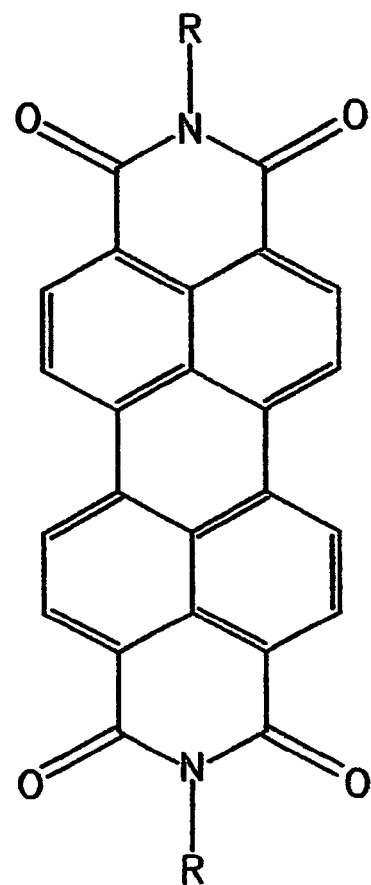
FIG. 3 is a diagrammatic depiction of the chemical structure of a fused-ring tetracarboxylic diimide compound based on a perylene framework used in the thin film of the invention such as the N,N' 3,4,9,10 perylene tetracarboxylic acid diimide that is illustrated.

The invention provides a device comprising an improved n-channel semiconducting film of N,N' 3,4,9,10 perylene tetacarboxylic acid diimide, having high mobility and on/off ratio. The n-channel semiconducting film comprises a fused-ring tetracarboxylic diimide compound based on a perylene framework, of the type illustrated in FIG. 3, that exhibits a field effect electron mobility greater than 0.6 $cm^2/Vs$ in film form. The mobilities exhibited with the invention in the range of 0.01–0.6 $cm^2/Vs$, are the highest thus far reported for n-channel materials. In addition, the n-channel film of the invention is capable of providing on/off ratios of at least 10000, advantageously at least 100000, with the off current measured with a zero gate-source voltage and a drain-source voltage between zero and 100 volts, the on current measured with a gate-source voltage of 100 V and a drain-source voltage between zero and 100 volts, not exceeding the drain-source voltage used for measuring the off current, and employing a gate dielectric with a capacitance of $6.9\times10^{-9}$ $F/cm^2$. The compounds involved in the invention have the capability of possessing significant volatility, such that vapor phase deposition, where desired, is readily achieved. In devices, individual transistors, implementation into a complementary circuits, such as inverter circuits, are achieved with the use of the n-channel organic compounds of the invention with an available p-type organic semiconductor, such as pentacene. The compounds are also capable of possessing significant volatility, such that vapor phase deposition, as a processing tool becomes readily achievable.

The contemplated compounds of the invention would include perylene 3,4,9,10 tetracarboxylic acid diimides, and heterocyclic variants thereof. One advantageous group of compounds is N,N'-perylene 3,4,9,10-tetracarboxylic acid diimides with linear chains of four to 18 saturated atoms, generally carbon atoms, affixed to each of the two imide nitrogens. The n-channel semiconductor compounds of the invention offer advantages over other previously reported n-channel compounds as they do not require treatment of the bottom-contact electrodes in order to obtain the desired high mobilities.

The invention provides a device comprising an improved n-channel semiconducting film, the film comprising a perylene tetracarboxylic acid diimide compound which exhibits a field effect electron mobility greater than 0.01 $cm^2/Vs$. Advantageously, the mobility is greater than 0.6 $cm^2/Vs$. In addition, the n-channel film of the invention is capable of providing on/off ratios of at least 10000, advantageously at least 100000. Moreover, these properties are attainable after exposure of the n-type semiconductor material to air, before film deposition, as well as exposure of the device and/or the channel layer to air after deposition.

The compounds of the invention take into account several parameters that contribute to desirable properties. The solid state structure of the material has the individual molecules packed such that the orbitals of the conjugated system, those containing the aromatic rings and/or the imide carbonyl groups of adjacent molecules, are able to interact, resulting in high mobility. The direction of this interaction has a component parallel to the direction of desired current flow in a device using this material as the active layer. The morphology of the films formed by the material is substantially continuous, such that current flows through the material without unacceptable interruption. In particular, the compounds of the invention contain a conjugated core structure having two or more fused aromatic rings along with electron withdrawing dicarboxylic imide substituents bearing linear alkyl chains.

The lowest lying unoccupied molecular orbital of the compound is at an energy that allows for injection of electrons at useful voltages from metals with reasonable work functions. This conjugated structure generally has a desirable lowest unoccupied molecular orbital (LUMO) energy level of about 3.5 to about 4.6 eV with reference to the vacuum energy level As known in the art, LUMO energy level and reduction potential approximately describe the same characteristics of a material. LUMO energy level values are measured with reference to the vacuum energy level, and reduction potential values are measured in solution versus a standard electrode. An advantage for device applications is that the LUMO in the crystalline solid which is the conduction band of the semiconductor and the electron affinity of the solid both are measured with reference to the vacuum level. The latter parameters are usually different from the former parameters which are obtained from solution.

The aromatic cores should not be so large that the compounds become difficult to process from solution, therefore maintaining less than 8 fused rings, where both the fused aromatic rings and the cyclic imide groups are counted is desirable. Perylene 3,4,9,10 tetracarboxylic acid diimides, and in particular the N,N'-dioctyl perylene-3,4,9,10-tetracarboxylic acid diimide derivative are considered to be particularly useful. The molecules are substituted with groups that allow for close packing of the conjugated cores, and that induce assembly of the compounds into thin films with appropriate molecular orientation and bulk morphology as evident by the high carrier mobility measured. Linear chains having a length of four to eighteen atoms are typically useful, with chains of 8 atoms being particularly useful.

It is advantageous to avoid substituents that tend to interfere with close approach of the conjugated cores. It is possible for substituents to be oriented out of the plane of the cores but still not interfere with their close approach if suitable stacking geometries are possible. It is also possible that properly selected substituents that will promote this desired close approach. In addition, chains longer than twelve atoms are possible, but tend to lower the solubility and/or volatility of the compounds.

The invention provides the capability of forming an n-type semiconductor compound having both a mobility that is greater than 0.6 $cm^2/Vs$ and a substantial on/off ratio.

The n-channel semiconductor of N,N' 3,4,9,10 perylene tetracarboxylic acid diimide, are capable of being formed on any suitable insulator as known in the art. Examples of such insulators include silicon dioxide, polymeric insulators such as polyimides, and silicon nitride, $Al_2O_3$, and insulators that exhibit a higher dielectric constant such as is discussed in U.S Pat. No. 5,981,970. A variety of gate and electrode materials, known in the art, are also suitable, including metals, degenerately doped semiconductors, conducting polymers, and printable materials such as carbon ink or silver-epoxy.

Deposition by a rapid sublimation method is also possible. One such method is to apply a vacuum of 35 mtorr to a chamber containing a substrate and a source vessel that holds the compound in powdered form, and heat the vessel over several minutes until the compound sublimes onto the substrate. Generally, the most useful compounds form well ordered films, with amorphous films being less useful. Devices for which the n-channel semiconductor films of the invention are useful include single thin film transistors (TFT)s and complementary inverter circuits. Other devices in which TFTs are useful, such as ring oscillators, and more complex circuits, e.g., shift registers, are also possible. The invention will be further clarified by the following examples, which are intended to be exemplary.

The synthesis of N,N'-dialkyl perylene tetracarboxylic acid diimides has been described in Rademacher, A. et al. *Chem. Ber.* 1982 115, 2927. In accordance with the invention, a mixture of perylene tetracarboxyic acid dianhydride, which is available from Aldrich Chemical Company, 3–4 equivalents excess of an amine, for example n-octylamine, also available from Aldrich, zinc acetate in catalytic amounts, and 10–15 ml of quinoline per gram of dianhydride molecule was heated over 4–5 hours at a temperature of ca. 220° C. The mixture is allowed to cool to room temperature, stir overnight, and the precipitated solids are collected, filtered and washed with acetone, followed by 200 ml each of boiling 0.1 M aqueous $Na_2CO_3$, boiling water, and warm toluene, that is kept below the temperature at which the product would be substantially dissolved. The final product may then be isolated by soxhlet extraction in toluene over a period of 2–4 days. The solvent is then evaporated, and the material is dried at 100° C. in vacuo overnight. The solid is then purified by sublimation at 10–5 to 10–6 torr.

A vapor phase-deposited TFT would for an example, be deposited and tested as follows. A heavily doped silicon substrate coated with 5000 Angstroms of $SiO_2$ and 600 Angstroms thick gold electrodes is loaded into a vacuum sublimation apparatus equipped with a water cooled substrate holder, and a film of a perylene tetracarboxylic acid diimide compound is evaporated onto the substrate (25–35 mTorr), generally about 500–5000 Angstroms thick.

The electrical characteristics of TFT's of the invention having an n-type organic semiconductor as the channel layer of N,N' perylene-3,4,9,10 tetracarboxylic acid diimide, a heavily doped Si-wafer as the gate electrode, thermally grown $SiO_2$ on the surface of the Si-wafer as the gate insulator, and Au source and drain electrodes, are adequately modeled by standard field effect transistor equations such as advanced in the S. M. Sze text "*Physics of Semiconductor Devices*", Wiley, New York 1981, pg. 442. Mobilities and on/off ratios are determined in the saturation region (see Sze in Semiconductor Devices—Physics and Technology, John Wiley & Sons (1981) from devices of channel width to length ratios larger than 10, scanning a range of zero to 100 volts for the gate-source voltage, while keeping the drain-source voltage constant at 100 V. Mobilities and on/off ratios are also determined in the linear region (see Sze in Semiconductor Devices—Physics and Technology, John Wiley & Sons (1981) from devices of channel width to length ratios larger than of about 10 to 20, scanning a range of zero to 100 volts for the drain-source voltage, while keeping the gate-source voltage constant and then repeating the whole process for a different constant gate-source voltage. The drain-source voltage is changed in a stepwise fashion from 100 V to approximately 0V, at a step of −10 V.

EXAMPLE 1

For N,N' perylene 3,4,9,10 tetracarboxylic acid diimide, the mobility calculated in the saturation region was between 0.1 and 0.6 cm$^2$/Vs, with an on/off ratio of 10000 to 100000 the gate voltage being scanned from 100 to 0 V, with measurement under a nitrogen atmosphere. The devices are exposed to air prior to testing.

The invention provides an improvement over the present state of the art where contact imperfections are considered to be detrimental to device mobility.

Figure 4:
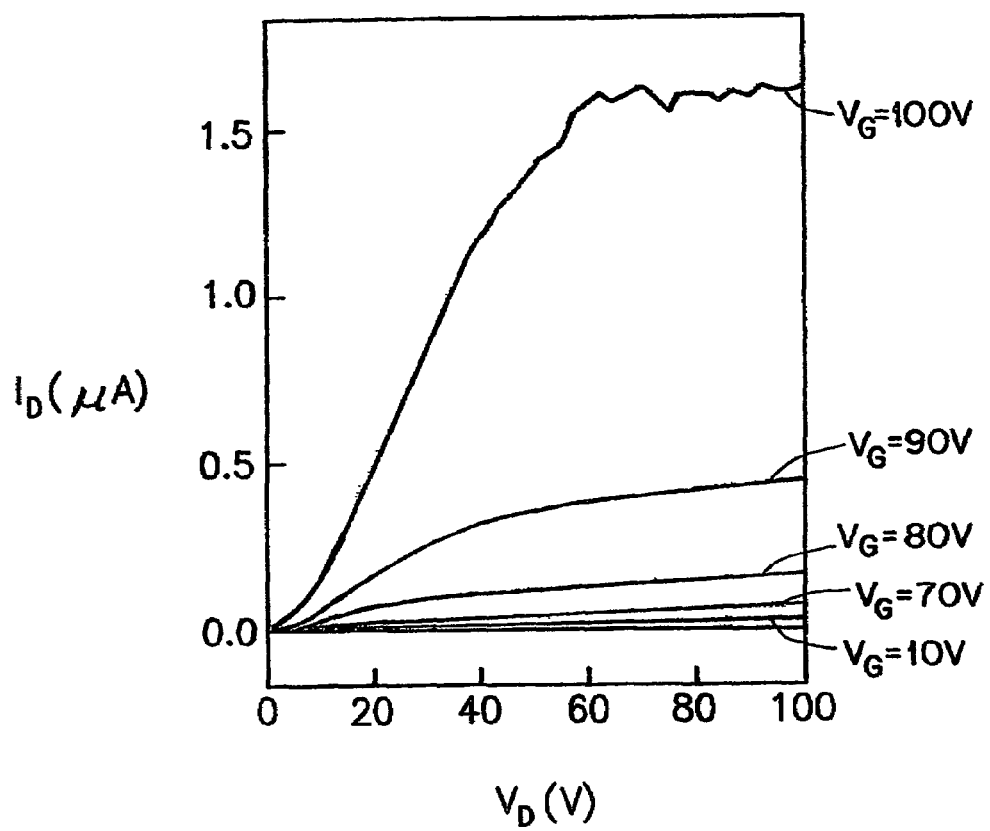
FIG. 4 is a graph illustrating nonlinearity resulting from contact imperfections in the devices of FIGS. 1 and 2.
Figure 5:
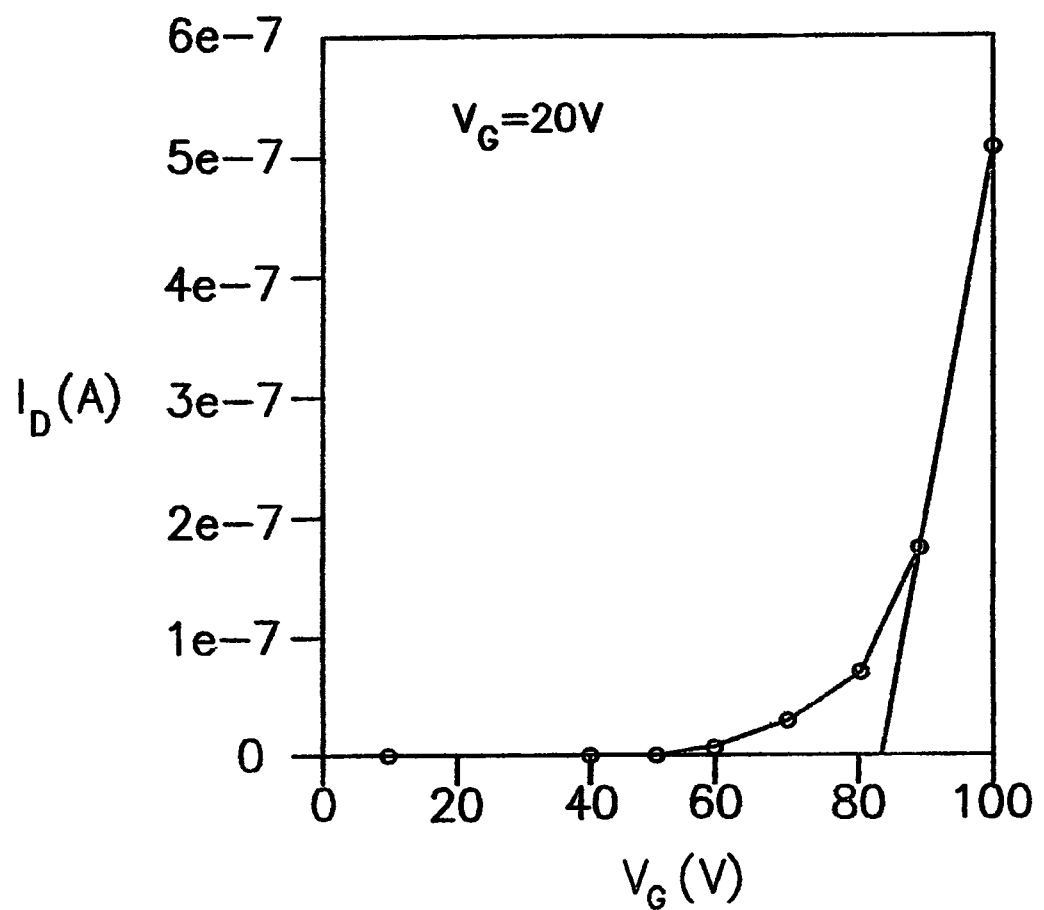
FIG. 5 is a graph illustrating the high mobility values achieved through the invention.

In FIGS. 4 and 5 data on a device is illustrated that has a N,N' perylene 3,4,9,10 tetracarboxylic acid diimide as the semiconducting layer, a heavily doped Si wafer as gate electrode, a 500 nm thick, thermally grown $SiO_2$ layer as the gate insulator, and Au source and drain electrodes deposited on the gate insulator corresponding to the bottom contact configuration that is depicted in FIG. 1. The channel length L of this device is 95 μm and the channel width W is 1500 μm.

The graph of FIG. 4 shows the dependence of the current flowing between source and drain electrodes ($I_D$) on the voltage applied to the drain electrode ($V_D$), at discrete voltages applied to the gate electrode ($V_G$). A non linearity is observed at low $V_D$, which can be attributed to contact imperfections.

In the graph of FIG. 5 the mobility measured in the linear regime, from the plot of $I_D$ vs $V_G$ at $V_D$=20 V is substantially lower than the mobility calculated in the saturation regime for the same device. Such behavior is true for all the devices of similar configuration and composition. For the device characterized by the data in the graphs of FIGS. 4 and 5 the calculated mobility from the linear region was 0.015 cm$^2$ V$^{-1}$ sec$^{-1}$.

Figure 6:
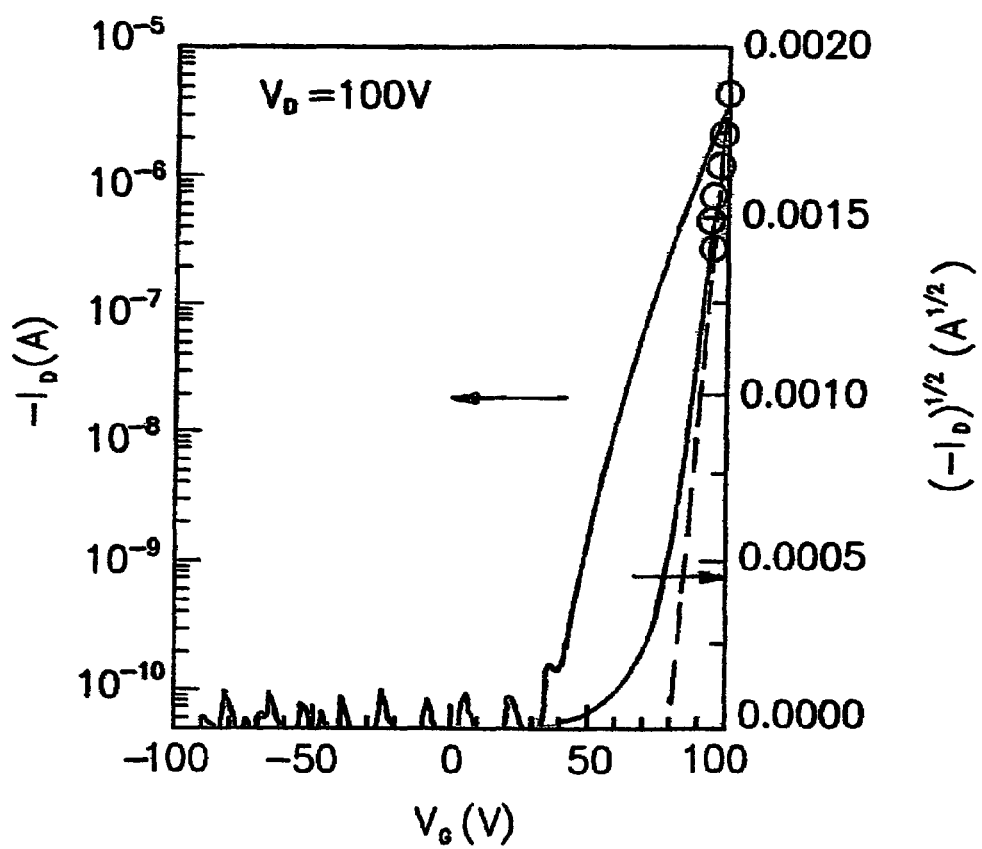
FIG. 6 is a graph illustrating the high on/off ratios achievable with the invention.

The graph of FIG. 6 corresponds to test data on a device having the invention material N,N' perylene 3,4,9,10 tetracarboxylic acid diimide as the semiconducting layer, a heavily doped Si wafer as gate electrode, a 500 nm thick layer of thermally grown $SiO_2$ as gate insulator, and Au source and drain electrodes deposited on the gate insulator which corresponds to the bottom contact configuration as depicted in FIG. 1. The channel length L of this device is 95 μm and the channel width W is 1000 μm.

FIG. 6 shows the dependence of log$I_D$ on $V_G$ (left y-axis) in the saturation region, when $V_D$=100 V. The field effect mobility, μ, was calculated from the slope of the $(I_D)^{1/2}$ vs. $V_G$ plot (right y-axis) to be 0.23 cm$^2$ V$^{-1}$ sec$^{-1}$ in the saturation region. The on/off ratio was 3.5×10$^4$ the threshold voltage $V_T$=80 V. Mobilities up to 0.6 cm$^2$ V$^{-1}$ sec$^{-1}$ were measured from similar devices in the saturation region which are the highest reported for n-channel materials, e.g., in the range of 0.01–0.6 cm$^2$/Vs with on/off ratios of at least 10000.

What has been described is the use of N,N' perylene 3,4,9,10 tetracarboxylic acid diimide in thin film form in a semiconductor device to improve mobility and on/off ratios.

The invention claimed is:

1. In the fabrication of organic thin film field effect semiconductor devices wherein there is an n-channel having source and drain contacts separated by said n-channel, an improvement for producing high electron mobility in said n-channel without treatment of the interface between said contacts and said organic thin film characterized by, said organic thin film being a compound with a N,N"-di(n-1H, 1H-perfluoroctyl)perylene 3,4,9,10-tetracarboxylic acid diimide structure.

2. The improvement of claim 1 wherein in said thin film field effect semiconductor devices there is a substrate with a gate electrode that is covered by a gate dielectric, said source and drain electrodes are positioned in contact with said gate dielectric and aligned with said gate, and, said thin film field effect devices being characterized by having an organic thin film semiconductor member of a compound having an N,N"-di(n-1H,1H-perfluoroctyl)perylene 3,4,9,10-tetracarboxylic acid diimide structure extending over said source and drain electrodes and in contact with said gate dielectric.

3. The improvement of claim 1 wherein in said thin film field effect semiconductor devices there is a substrate with a gate electrode that is covered by a gate dielectric, said devices being characterized by having an organic thin film semiconductor member of a compound having an N,N"-di (n-1H,1H-perfluoroctyl)perylene 3,4,9,10-tetracarboxylic acid diimide structure positioned in contact with and extending over said gate dielectric, and, source and drain electrodes positioned in contact with said organic thin film semiconductor member and aligned with said gate.

* * * * *